United States Patent [19]
Wade et al.

[11] Patent Number: 5,481,555
[45] Date of Patent: Jan. 2, 1996

[54] SYSTEM AND METHOD FOR ERROR DETECTION AND REDUCING SIMULTANEOUS SWITCHING NOISE

[75] Inventors: Paul C. Wade, Shirley; Samuel H. Duncan, Arlington; Donald W. Smelser, Bolton, all of Mass.

[73] Assignee: Digital Equipment Corporation, Maynard, Mass.

[21] Appl. No.: 206,914

[22] Filed: Mar. 7, 1994

Related U.S. Application Data

[63] Continuation of Ser. No. 546,245, Jun. 29, 1990, abandoned.

[51] Int. Cl.$^6$ ............................. G06F 11/00; H03M 13/00
[52] U.S. Cl. ............................. 371/57.2; 371/64; 341/58; 326/26
[58] Field of Search ............................. 371/57.2, 57.1, 371/64, 52, 37.1; 341/58, 94; 307/443, 542

[56] References Cited

U.S. PATENT DOCUMENTS

| | | | |
|---|---|---|---|
| 3,015,805 | 1/1962 | Thyen | 340/825.77 |
| 3,250,998 | 5/1966 | Benmussa | 371/69.1 |
| 3,568,149 | 3/1971 | Sibley | 371/52 |
| 3,631,471 | 12/1971 | Griffiths | 341/58 |
| 3,646,517 | 2/1972 | Waters et al. | 371/57.1 |
| 3,902,117 | 8/1975 | Sheppard | 371/57.2 |
| 4,309,694 | 1/1982 | Henry | 341/58 |
| 4,334,310 | 6/1982 | Maley | 371/64 |
| 4,414,659 | 11/1983 | Beckers | 369/59 |
| 4,486,739 | 12/1984 | Franaszek et al. | 340/347 DD |
| 4,569,050 | 2/1986 | Ohme | . |
| 4,620,311 | 10/1986 | Schouhamer Immink | 375/19 |
| 4,675,880 | 6/1987 | Davarian | 375/39 |
| 4,811,361 | 3/1989 | Bacou et al. | 375/25 |
| 5,016,258 | 5/1991 | Tanaka et al. | 375/25 |
| 5,022,051 | 6/1991 | Crandall et al. | 375/19 |
| 5,042,037 | 8/1991 | Endoh | 371/57.1 |
| 5,142,167 | 8/1992 | Temple et al. | 307/443 |

FOREIGN PATENT DOCUMENTS

| | | |
|---|---|---|
| 1569076 | 6/1980 | United Kingdom . |
| 2041702 | 9/1980 | United Kingdom . |
| 2083322 | 3/1982 | United Kingdom . |
| 2099263 | 12/1982 | United Kingdom . |
| 2232858 | 5/1989 | United Kingdom . |

OTHER PUBLICATIONS

IBM Technical Disclosure Bulletin, "Code for Leveling Bus Driver Current", Feb. 1988, vol. 30, No. 9.
Bergmann, et al., AT&T Technical Journal, "Half Weight Block Codes for Optical Communications", Jun. 1986, vol. 65, No. 3.

*Primary Examiner*—Robert W. Beausoliel, Jr.
*Assistant Examiner*—Ly Vi Hua
*Attorney, Agent, or Firm*—Kenyon & Kenyon

[57] ABSTRACT

A system and method that reduces the simultaneous switching noise of outputs and the processing delays caused by inductance by using an encoding scheme that results in a net signaling current of substantially zero at each cycle time for the fast parallel switching networks of digital integrated circuit chips and that provides multiple types of error detection.

48 Claims, 9 Drawing Sheets

SYSTEM AND METHOD FOR ERROR DETECTION AND REDUCING SIMULTANEOUS SWITCHING NOISE

This is a continuation of application Ser. No. 07/546,245 filed Jun. 29, 1990, now abandoned.

TECHNICAL FIELD

The present invention relates generally to systems and methods that are used to reduce the amount of noise caused by simultaneously switching output pins of digital integrated circuit chips. More specifically, the present invention relates to systems and methods that are used to reduce the amount of noise caused by simultaneously switching output pins of digital integrated circuit chips and that also provide multiple types of error detection.

BACKGROUND OF THE INVENTION

In the evolutionary development of digital integrated circuit ("IC") chips, their capabilities have improved dramatically. These improvements include a sharp increase in the speed at which these IC chips process data. Coupled with these improvements is a decrease in the package size of these chips.

One of the problems that has affected the operation of advanced digital IC chips is simultaneous switching noise. This noise is generated by a chip's output pins switching from a driving current to a sinking current or vice-versa in a very short period of time, for instance in 1–3 ns (nanoseconds). Thus, the greater the number of output pins that simultaneously switch in this short period of time, the greater the noise level. When this simultaneous switching noise becomes great enough, it may cause data transmission errors.

Simultaneous switching noise was not a critical problem in older digital IC chip designs because the cycle times were much longer and the switching rise and fall times were slower than those for the advanced digital IC chips. Since the cycle times in these older chip designs were much longer than those in the advanced digital IC chips, output pin switching could be spread out over this long cycle time which greatly reduced the likelihood that simultaneous switching noise would be great enough to cause data transmission errors.

These longer cycle times also lended themselves to other schemes for reducing the chances of generating enough simultaneous switching noise to cause data transmission errors. For example, longer cycle times could be divided into portions that were devoted to just data transmission and others devoted to just switching the output pins. The portions devoted to switching the output pins would be long enough to spread the switching out so that there was only a very small possibility that the simultaneous switching noise would ever reach a level sufficient to cause data transmission errors.

The luxury of long cycle times is not available in advanced digital IC chips. The few nanoseconds during which a requisite number of simultaneously switching output pins may generate a noise level that is sufficient to cause data transmission errors may be ½ or more of the cycle time of these advanced chips. Accordingly, there is not a sufficient cycle time to solve the simultaneous switching problem as it was done in older IC chip designs.

Simultaneous switching noise is proportional to the number of output pins that change during a particular short time period. There are situations in which changing from one output pattern to another will necessarily cause the simultaneous switching noise to be at a level high enough to cause data transmission errors. Therefore, there is some pattern dependency for generating data transmission errors. This can only be prevented by reducing the simultaneous switching noises.

There have been a number of suggested solutions to the simultaneous switching noise problem in advanced digital IC chips; however, these solutions either require that the digital IC chip undergo costly reconfiguration, or significantly affect the effective data bandwidth or the speed at which the digital IC chips process information.

One suggestion to reconfigure the digital IC chips is to make all of the output pins differential pins. Hence, each bit is transmitted by two complementary pins so that the net signaling current for that bit is zero. Even though the simultaneous switching noise is reduced and the full transition speeds are allowed, this scheme uses two output pins per bit which cuts the effective data bandwidth in half. Obviously, it will take twice as much time or twice as many output pins to get signals off a chip as it would for a chip configured with single-ended output pins. This solution is not desirable.

Another suggestion is to reconfigure the digital IC chips to include a greater number of ground pins or ensure that the chip has a ground level plane. These have the effect of reducing the inductance at single-ended output pins, and thereby the switching noise. Even when either one of these is provided and the inductance is reduced, there still is a substantial amount of inductance remaining at each output pin. Thus, it simply takes a larger number of simultaneously switching output pins to generate sufficient noise to cause data transmission errors.

Since most systems today are synchronous switching type systems, another suggestion is to wait to sample the output waveform after a time period that ensures that the simultaneous switching noise has died out. Obviously, this necessarily requires lengthening the cycle time which, as stated, is highly undesirable in fast switching parallel system such as advanced digital IC chips.

Another suggested method is simply to spread out the switching time but not to the extent that it was done in older digital IC chip designs. Again, this will require lengthening of the cycle time which is not desired.

In the past, an error detection method was used for long distance transmissions of serial data. According to this method, it is desirable to eliminate the DC component of the transmission. This is done by ensuring that an equal number "1s" and "0s" are transmitted in the serial data over a long period of time—an averaging method. This, however, would not be too effective with fast parallel switching networks of digital IC chips.

There is a need to overcome these problems and provide a system and method for reducing simultaneous switching noise, while at the same time providing effective error detection, all without significantly changing the effective data bandwidth.

SUMMARY OF THE INVENTION

The present invention is a system and method for reducing the amount of simultaneous switching noise that may cause data transmission errors and for providing effective error detection.

According to the system and method of the present invention, data signals that are to be output from the output pins of a digital IC chip are encoded so that at every cycle they contain an equal number of "1s" and "0s" allowing the net signaling current to be approximately zero. This reduces the simultaneous switching noise and any delay penalty caused by inductance, thereby minimizing the possibility of causing data transmission errors based on simultaneous switching noise. This is accomplished without substantially increasing the effective data bandwidth and it reduces the number of ground return pins that are required for the chip design.

The system and method of the present invention also incorporate multiple error detection techniques for detecting errors in the encoded transmission and decoded transmission.

The system and method of the present invention is set forth in detail in the remainder of the application and shown in the accompanying drawings.

DETAILED DESCRIPTION OF THE INVENTION

The present invention is a system and method for reducing the amount of switching noise generated by simultaneously switching outputs and for providing multiple types of error detection.

The system and method of the present invention are useful for digital ICs chips, especially bipolar devices and even more particularly emitter-coupled logic ("ECL") IC chips. According to the present invention, the simultaneous switching noise and the processing delays caused by inductance are reduced by an encoding scheme that results in a net signaling current of about zero at each cycle time for fast parallel switching networks of digital IC chips.

The encoding scheme of the system and method of the present invention is used to encode single-ended output pins of digital IC chips. According to this encoding scheme, each encoded word has an equal number of "1s" and "0s," so there will be an equal number of driving currents and sinking currents, leaving a net signaling current of zero. According to this encoding scheme, the following expressions are applicable:

$$S = N/2 \quad (1)$$

where,

S=Number of "1s" in the encoded word.

N=Total number of bits in the encoded word.

$$T = N/2 \quad (2)$$

where,

T=Number of "0s" in the encoded word.

N=Total number of bits in the encoded word.

$$S = T \quad (3)$$

where,

S=Number of "1s" in the encoded word.

T=Number of "0s" in the encoded word.

Many computers and, therefore, the digital IC chip which are components of those computers, operate on 32-bit words. Hence, for the purpose of discussing the system and method of the present invention, a 32-bit word will be considered the standard length word. It is to be understood that other length words, both longer and shorter, are considered within the scope of the present invention.

The encoding of a binary 32-bit word according to the encoding scheme system and method of the present invention will be discussed referring to Table 1.

TABLE 1

| No. Of Bits To Be Encoded | No. of Encode Bits | Eff. | No. Of Poss. Combos. Used To Encode Bits | No. Of Combos. Used To Encode Bits |
| --- | --- | --- | --- | --- |
| 1  | 2  | 50% | 2        | 2        |
| 2  | 4  | 50% | 6        | 4        |
| 3  | 6  | 50% | 20       | 8        |
| 4  | 6  | 66% | 20       | 16       |
| 5  | 8  | 63% | 70       | 32       |
| 6  | 8  | 75% | 70       | 64       |
| 7  | 10 | 70% | 252      | 128      |
| 8  | 12 | 66% | 924      | 256      |
| 9  | 12 | 75% | 924      | 512      |
| 10 | 14 | 71% | 3432     | 1024     |
| 11 | 14 | 79% | 3432     | 2048     |
| 12 | 16 | 75% | 12870    | 4096     |
| 13 | 16 | 81% | 12870    | 8192     |
| 14 | 18 | 78% | 48620    | 16384    |
| 15 | 18 | 83% | 48620    | 32768    |
| 16 | 20 | 75% | 184756   | 65536    |
| 17 | 20 | 85% | 184756   | 131072   |
| 18 | 22 | 82% | 705432   | 262144   |
| 19 | 22 | 86% | 705432   | 524288   |
| 20 | 24 | 83% | 2028117  | 1048576  |
| 21 | 26 | 81% | 7800450  | 2097152  |
| 22 | 26 | 85% | 7800450  | 4194304  |
| 23 | 28 | 83% | 30087450 | 8388608  |
| 24 | 28 | 86% | 30087450 | 16777216 |
| 25 | 30 | 83% | 116338140 | 33554432 |
| 26 | 30 | 87% | 116338140 | 67108864 |
| 27 | 32 | 84% | 300540195 | 134217728 |
| 28 | 32 | 89% | 300540195 | 268435456 |
| 29 | 34 | 85% | 1166402480 | 536870912 |
| 30 | 34 | 88% | 1166402480 | 1073741824 |
| 31 | 36 | 86% | 4536567650 | 2147483648 |
| 32 | 36 | 88% | 4536567650 | 4254967296 |

In Table 1, the first column is the number of bits of the original 32-bit word that are grouped for encoding. That is, the 32-bit word to be encoded may be divided into groupings of bits for purposes of encoding. These bit groupings may range for a grouping of 1 bit to a grouping of 32 bits. The complexity for encoding increases with the grouping size.

The second column is the number of bits that result from the encoding scheme.

The third column is the efficiency in effective data bandwidth of the grouping before and after encoding. The efficiency is determined by the expression:

$$\text{Eff.} = M/N \tag{4}$$

where,

M=Number of bits in the first column.

N=Number of bits in the second column.

The efficiency ranges from 50% at the smaller groupings to 89% for larger groupings.

The fourth column represents the number of possible combinations that are available for encoding the bits in the second column. And, the fifth column is the number of combinations that are used to encode bits in the second column.

The encoding scheme of the system and method of the present invention is based on there being a net signaling current of zero at each cycle time. To achieve this, the encoded word must include equal numbers of "1s" and "0s."

According to the encoding scheme of the system and method of the present invention, for each bit grouping from 1 to 32 that is shown in the first column of Table 1, the number of encoding combinations that is required for that bit grouping is determined by the expression:

$$\text{No. of Combos. Used} = 2^M \tag{5}$$

where,

M=Number of bits in the first column.

These combinations are shown in the fifth column of Table 1.

For each of the even number of encode bits, the possible number of encoding combinations is determined by the expression:

$$\text{Poss. Combos.} = \frac{N!}{(1/2\,N)! * (1/2\,N)!} \tag{6}$$

where,

Poss. Combos.=Possible number of combinations according to N encode bits.

N=Even number of encode bits.

These combinations are shown in the fourth column of Table 1.

After these determinations are made, the number of combinations for the different groupings of bits (according to expression (5)) is compared with the possible number of encoding combinations for the even number of encode bits (according to expression (6)). The number of encode bits for a grouping is then determined to be that number of encode bits associated with the largest number of possible encoding combinations (according to expression (6)) that the number of encoding combinations (according to expression (5)) does not exceed.

As an example, in Table 1, a 6-bit grouping will require 64 encoding combinations (according to expression (5)). The possible number of encoding combinations for 6, 8, and 10 encode bits is 20, 70, and 252, respectively (according to expression (6)). The 20 encoded combinations for 6 encode bits is less than 64 and 70 encode combinations is just above 64, while 252 encode combinations is well above 64. For efficient use of the encode bits, 8 encode bits would be selected to encode 6-bit groupings of the 32-bit word since it is the closest number of possible combinations that is greater than the required number of combinations.

A greater number than 8 encode bits could be used, such as 10 encode bits, but the efficiency will suffer: 6 encoded to 8 has 75% efficiency, while 6 encoded to 10 has 60% efficiency. Thus, 8 encode bits would be selected to encode 6-bit groupings of the 32-bit word.

The encoding scheme of the present invention will now be discussed referring to the figures and Table 1.

Figure 1A:
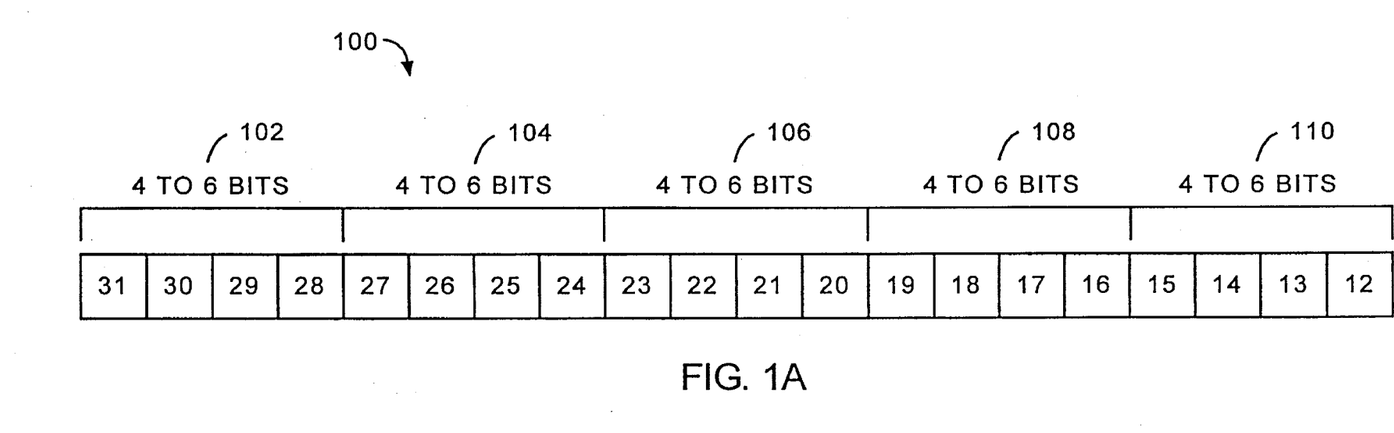
FIGS. 1A and 1B shows a representative first encoding scheme according to the present invention.
Figure 1B:
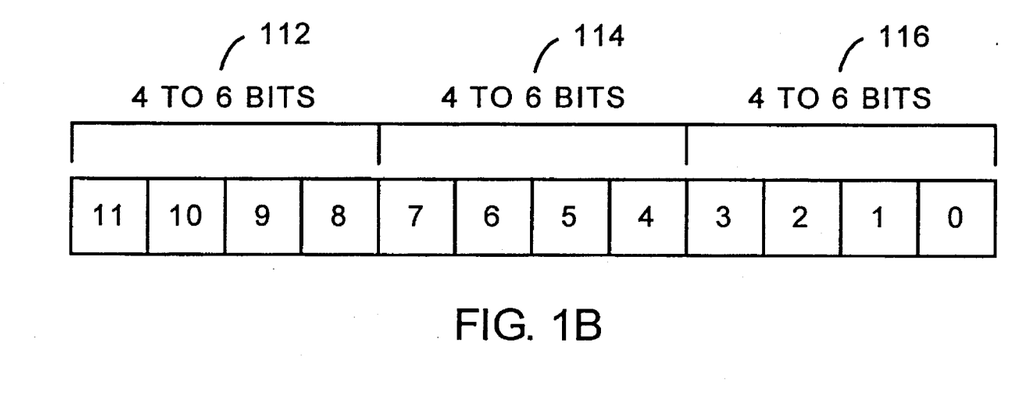

Referring to FIG. 1, a first representative encoding of a 32-bit word according to the present invention is shown. As is shown in the figure, 32-bit word 100 is divided into eight 4-bit groupings. These are <31:28> at 102, <27:24> at 104, <26:20> at 106, <19:16> at 108, <15:12> at 110, <11:8> at 112, <7:4> at 114, and <3:0> at 116. According to the encoding scheme of the system and method of the present invention described above, each 4-bit grouping will encode to 6 encode bits (See Table 1). According to expression (5) and column 5 of Table 1, each 4-bit grouping may have one of 16 values and each of these 16 values is assigned one of the 20 possible encoding combinations of equal "1s" and "0s" that is shown in Table 2.

TABLE 2

| | |
|---|---|
| 111000 | 000111 |
| 110100 | 001011 |
| 110010 | 001101 |
| 110001 | 001110 |
| 101100 | 010011 |
| 101010 | 010101 |
| 101001 | 010110 |
| 100110 | 011001 |
| 100101 | 011010 |
| 100011 | 011100 |

The selection and assignment of one of the 20 encoding combinations for a particular 4-bit value does not have to follow any predetermined pattern. For instance, the 4 bit value 0101 (or 9) may be at bits <31:28> and encode to 6 encode bit encoding combination 011100, while the 4 bit value 1111 (or 15) may be at bits <27:24> and encode to 6 encode bit encoding combination 000111.

Since each of the eight 4-bit groupings is encoded to 6 encode bits, when encoded, the original 32-bit word is 48-bits long. This 48-bit encoded word has an equal number of "1s" and "0s." Hence, the net signaling current is approximately zero which minimizes, if not eliminates, the chance that there will be enough simultaneous switching noise to cause data transmission errors regardless of the number of output pins that simultaneously by switch.

Figure 2A:
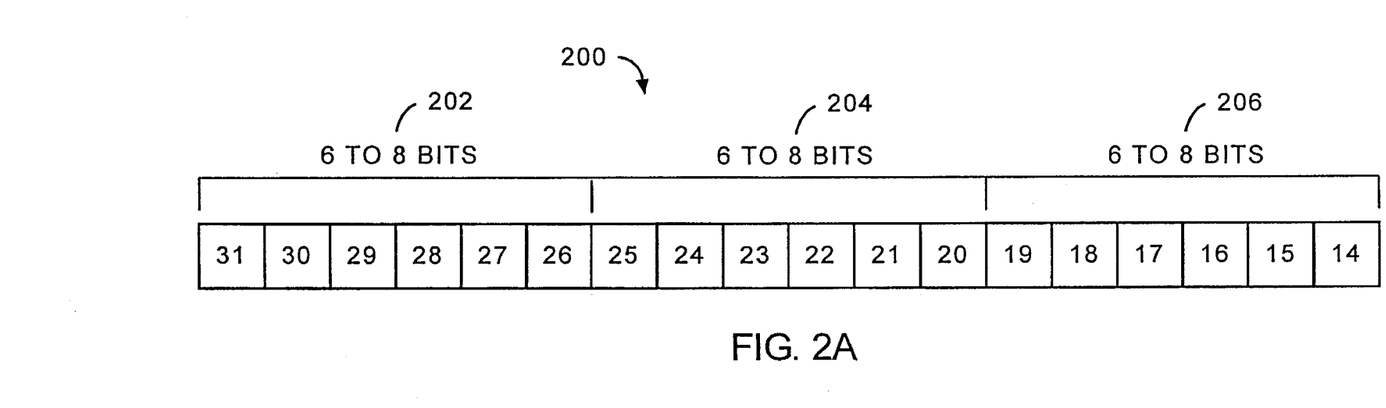
FIGS. 2A and 2B shows a representative second encoding scheme according to the present invention.
Figure 2B:
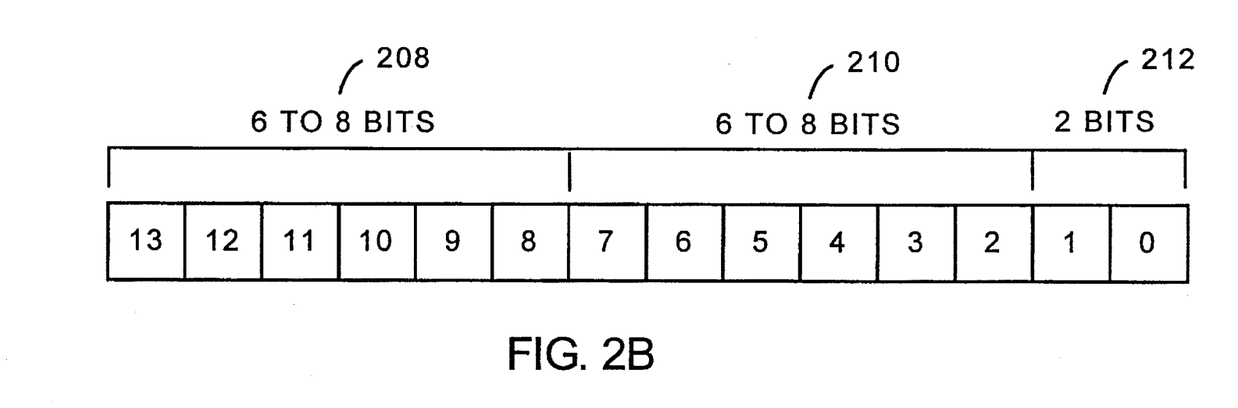
Figure 5A:
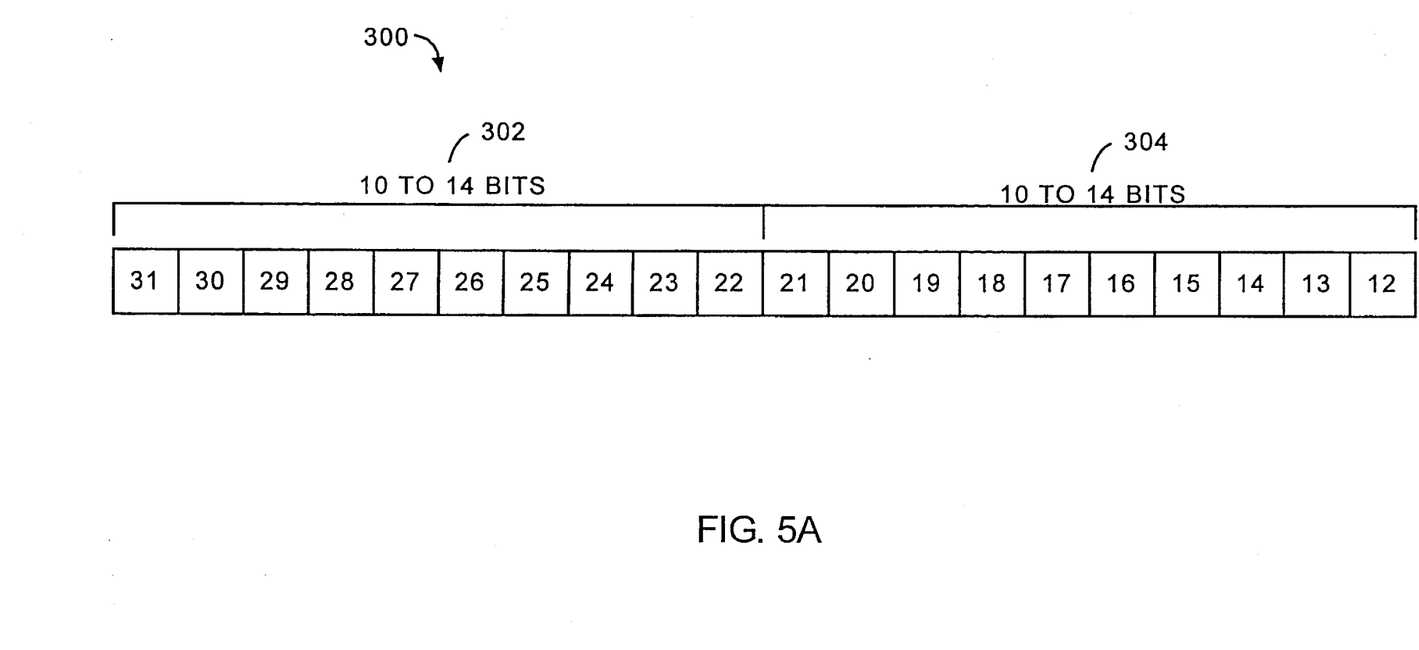
FIGS. 5A and 5B shows a representative third encoding scheme according to the present invention.
Figure 5B:
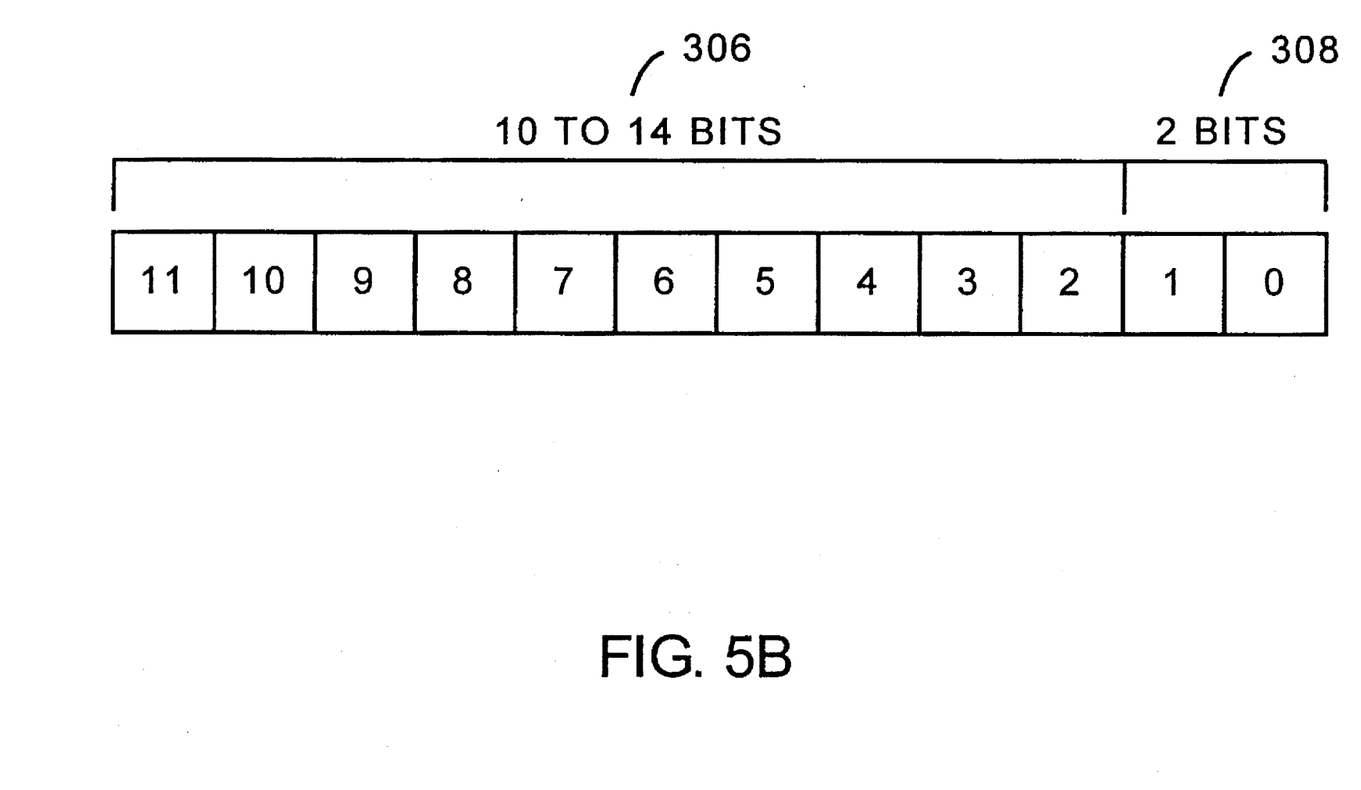

FIGS. 2 and 5 show other grouping of bits of the 32-bit word: FIG. 2 shows groupings of 6 bits and FIG. 5 shows groupings of 10 bits. The encoding principle described above with regard to 4-bit groupings also applies to each of the other grouping of the bits in the first column of Table 1, with FIGS. 2 and 5 being just two representative groupings.

Another aspect of the present invention is that error detection is coupled with the encoding scheme of the system and method of the present invention. The error detection methods of the present invention are incorporated with the encoding scheme to minimize the number of bits that have to be transmitted for any encoded word.

Figure 8:
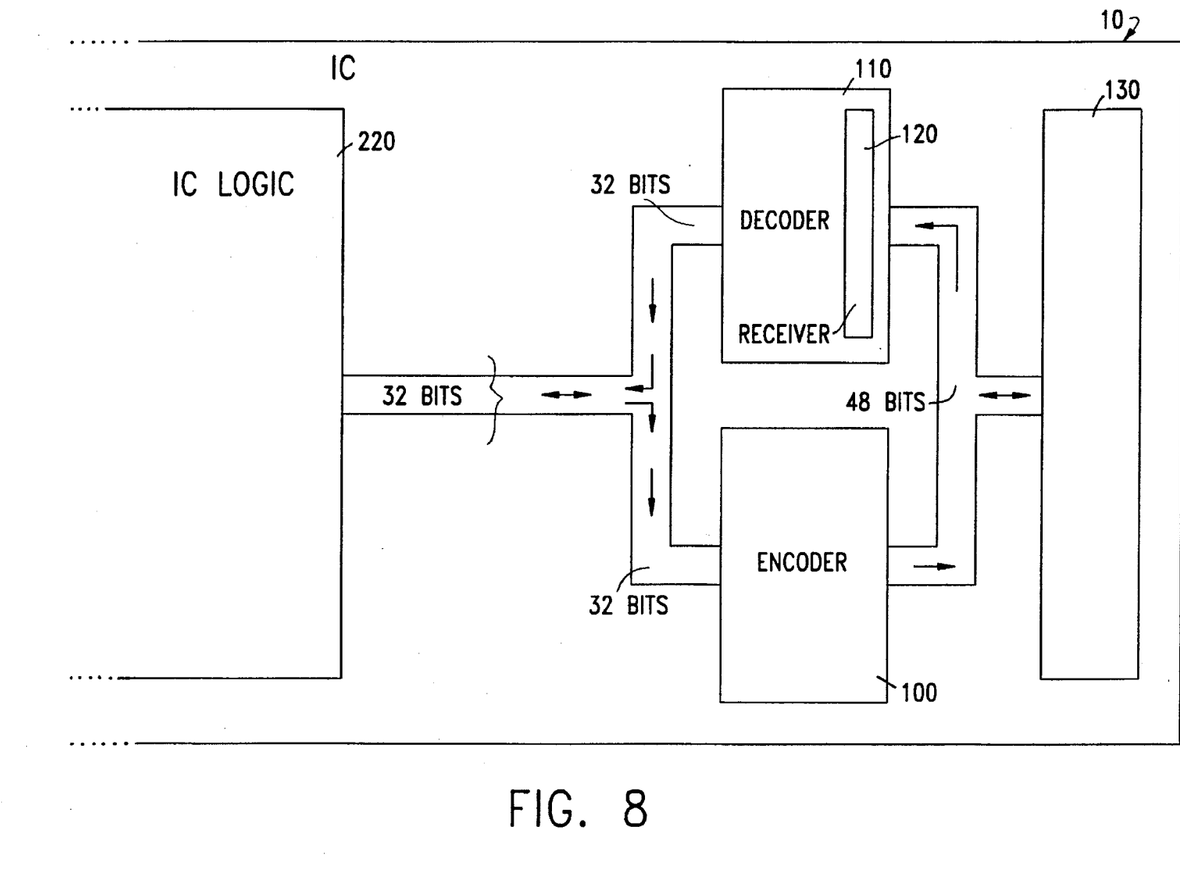
FIG. 8 shows an illustrative embodiment of the present invention.

The first type of error detection is more readily understood referring to FIGS. 1 and 8. In FIG. 1, the 32-bit word is divided into eight 4-bit groupings. Each grouping is encoded to 6 encode bits. Since there are eight 4-bit groupings, all 32 bits are included in one of the groupings.

FIG. 8 shows an exemplary system according to the present invention. An IC 10 includes an encoder 100 and a decoder 110, each coupled to outputs 130 of the IC 10. As shown, when the 32-bit word is encoded by the encoder 100, the resulting encoded word is 48 bits long. This 48 bit word includes an equal number of "1s" and "0s," in accordance with expressions 1, 2, and 3, above. Thus, on the decoder 110, at a receiver 120, the number of "1s" and "0s" can be counted to determine if they are equal. If the received number of "1s" equals the received number of "0s," then there is no single bit data transmission error in the encoded word. If there is a difference in these numbers, there is a data transmission error of the encoded word. This method of error detection is always available because the encoding scheme of the present invention requires that the encoded word contain an equal number of "1s" and "0s."

Figure 3:
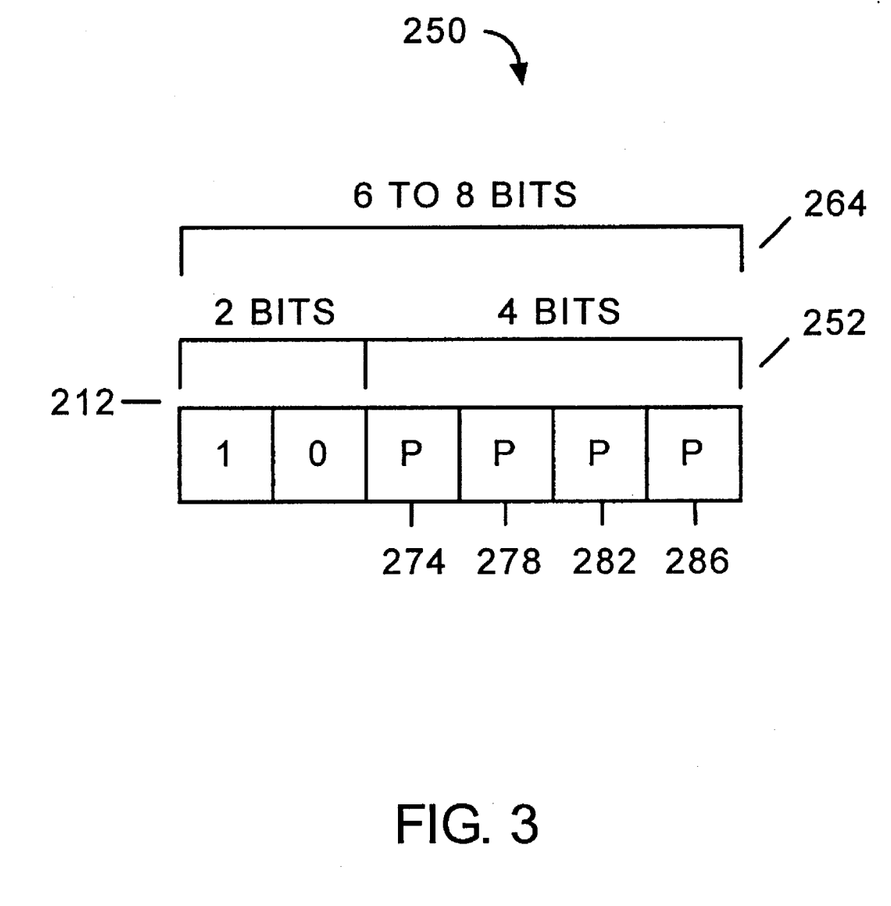
FIG. 3 shows a grouping of bits for encoding that includes the low order bits of the word in FIG. 2 and error detection bits.
Figure 4:
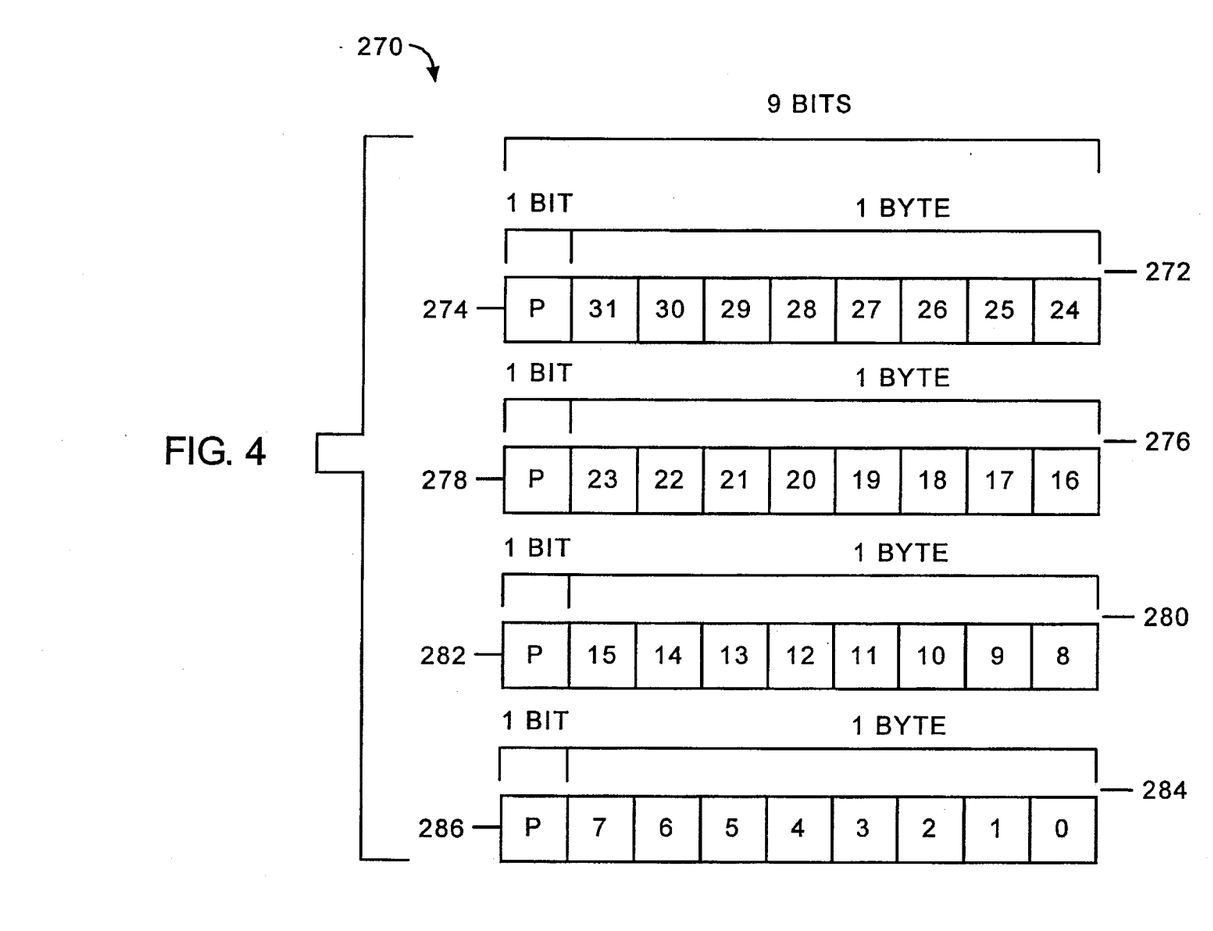
FIG. 4 shows the bytes of the word in FIG. 2 with their associated error detection bits.

Referring to FIGS. 2, 3, and 4, simultaneous switching noise reduction with "1s" and "0s" count error detection and single-bit error detection will be discussed.

32-bit word 200 is divided into five 6-bit groupings and one 2-bit grouping. They are <31:26> at 202, <25:20> at 204, <19:14> at 206, <13:8> at 208, <7:2> at 210, and <1:0> at 212. Since the grouping at 212 is only 2 bits, 4 bits are added so that this last grouping will have 6 bits like the other five groupings: <31:26> at 202, <25:20> at 204, <19:14> at 206, <13:8> at 208, <7:2> at 210. The 4 bits that are added may be "X" (no care) bits or they may be used for single-bit error detection.

Referring specifically to FIG. 3 at 250, the last 6-bit grouping at 264 is shown. This grouping includes the 2 bits at 212 and the 4 bits shown at 252. The bits at 252 are bits 274, 278, 282, and 286. This 6-bit grouping, along with the other five 6 bit groupings, are each encoded to 8 encode bits. This will mean that the encode word is 48 bits long, the same as the encoded word in FIG. 1.

The 4 bits that are added to the low order bits of a 32-bit word may be parity bits. Thus, each of these bits may be used to provide byte parity to the 4 bytes of the 32-bit word. The assignment of the parity bits at 252 to the bytes of the 32-bit word is shown generally at 270 in FIG. 4. According to that figure, parity bit 274 is assigned to byte <31:24> at 272, parity bit 278 is assigned to byte <23:16> at 276, parity bit 282 is assigned to byte <15:8> at 280, and parity bit 286 is assigned to <7:0> at 284.

Therefore, the 6-bit groupings of the bits of the 32-bit word provide two types of error detection. The first is error detection based of an equal number of "1s" and "0s" in the 48-bit encoded word. The second is error detection based on a parity bit for each byte of the 32-bit word.

Figure 6:
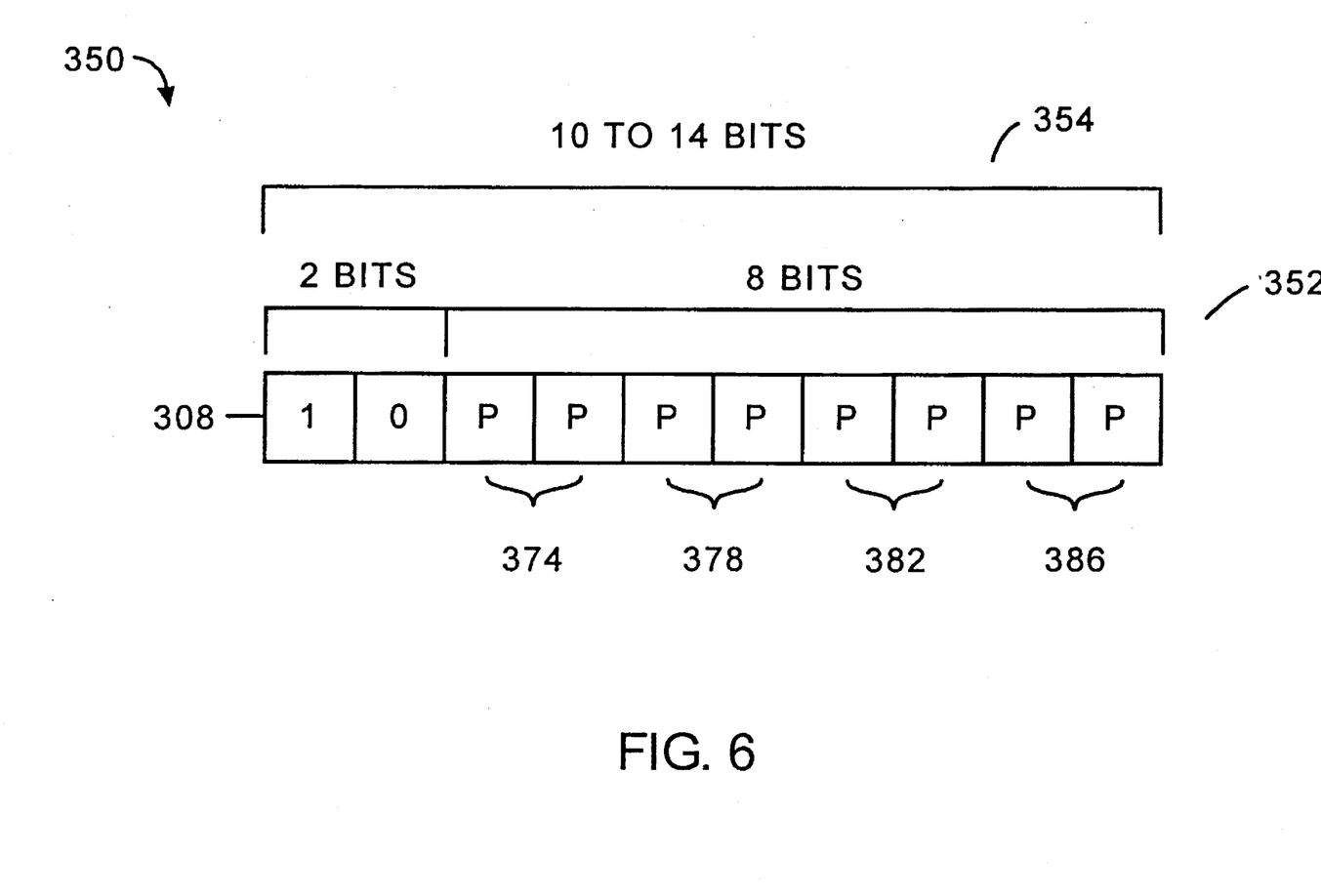
FIG. 6 shows a grouping of bits for encoding that includes the low order bits of the word in FIG. 5 and error detection bits.
Figure 7:
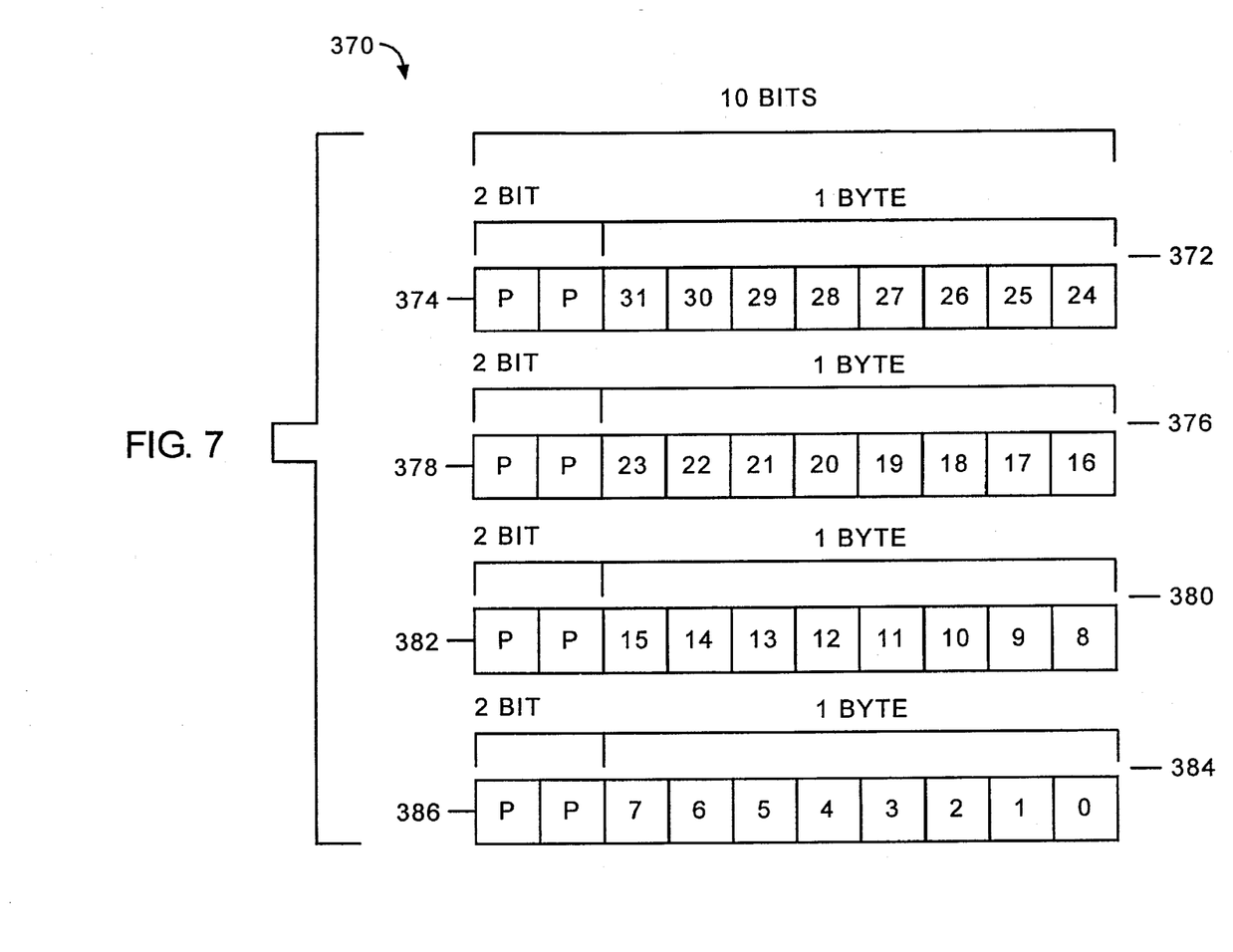
FIG. 7 shows the bytes of the word in FIG. 5 with their associated error detection bits.

Referring to FIGS. 5, 6, and 7, simultaneous switching noise reduction with "1s" and "0s" count error detection and full two-bit error detection will be discussed.

32-bit word 200 is divided into three 10-bit groupings and one 2-bit grouping. These groupings as shown in FIG. 5 are: <31:22> at 302, <21:12> at 304, <11:2> at 306, and <1:0> at 308.

To complete the last grouping, 8 bits are added to the 2 low order bits of the 32 bit word. The bits that are added may be "X" (no care) bits but are likely used to provide full two-bit error detection.

Referring to FIG. 6 generally at 350, 10-bit grouping 354 is shown. This last grouping includes the 2 bits at 308 plus the 8 bits shown at 352. The bits at 352 are bit pairs at 374, 378, 382, and 386. 10-bit grouping 354 and the three other 10-bit groupings are each encoded to 14 encode bits. The encoded word is 56 bits long, which is slightly longer than the encoded words at FIGS. 1 and 2.

As shown at FIG. 7, the 8 bits (or 4 pairs of bits) that were added may be parity bits. A pair of parity bits is associated with each byte of original 32-bit word to provide full two-bit error detection. According to FIG. 7, the assignment of parity bits is the pair of parity bits at 374 is assigned to byte <31:24> at 372, the pair at 378 to byte <23:16> at 376, the pair of parity bits at 382 to byte <15:8> at 380, and the pair of parity bits at 386 to <7:0> at 384.

The 10-bit groupings of the bits of the 32-bit word, therefore, permit two types of error detection. The first is error detection based on the equal number of "1s" and "0s" in the encoded 56-bit word. The second is error detection based on full two-bit (double bit) error detection.

It is to be understood that when two bits per byte are provided one may be used for single-bit error detection, while the other may have an unrelated use.

The terms and expressions that are used herein are used as terms of expression and not of limitation. And, there is no intention in the use of such terms and expressions of excluding the equivalents of the features shown and described, or portions thereof, it being recognized that various modifications are possible in the scope of the invention.

We claim:

1. A system for providing a net signalling current of substantially zero at each cycle time for reducing a noise level for simultaneous switching outputs of an integrated circuit chip and generating a signal having at least one error detection bit, the system comprising an encoder that encodes an R bit input word to an S bit output word, the encoder encoding each of P groupings of M number of binary bits of the R bit input word to an even number of N encode binary bits to form the S bit output word, the M number of binary bits being selected such that one P grouping of M number of binary bits includes binary bits of the R bit input word and at least one error detection bit for each byte of the R bit input word, the combinations of N encode binary bits including an equal number of binary "1" values and binary "0" values, with P>0, M>0, R>0, N an even number, and N an even number >M.

2. The system as recited in claim 1, wherein the encoder encodes each combination of M number of binary bits according to one combination of N encode binary bits selected from a set of combinations of N encode binary bits determined by the expression:

$$\text{Combos. of } N \text{ Encode Binary Bits} = \frac{N!}{(1/2\ N)! * (1/2\ N)!}$$

where,

N=Even number of bits greater than M number of bits.

3. The system as recited in claim 2, wherein the encoder encodes each combination of the M number of binary bits according to one of the $2^M$ combinations from the set of combinations of N encode binary bits, with M< 0.

4. The system as recited in claim 1, wherein the at least one error detection bit associated with each byte is a single-bit error detection bit.

5. The system as recited in claim 4, wherein the single-bit error detection bit includes a parity bit.

6. A system for providing a net signalling current of substantially zero at each cycle time for reducing a noise level for simultaneous switching outputs of an integrated circuit chip and generating a signal having at least two error detection bits, the system comprising an encoder that encodes an R bit input word to an S bit output word, the encoder encoding each of P groupings of M number of binary bits of the R bit input word to an even number of N encode binary bits to form the S bit output word, the M number of binary bits being selected such that one P grouping of M number of binary bits includes binary bits of the R bit input word and at least two error detection bits for each byte of the R bit input word, the combinations of N encode binary bits including an equal number of binary "1" values and binary "0" values, with P>0, M>0, R>0, N an even number, and N an even number >M.

7. The system as recited in claim 6, wherein the encoder encodes each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

8. The system as recited in claim 7, wherein the encoder encodes each combination of the M number of binary bits according to one of the $2^M$ combinations from the set of combinations of N encode binary bits, with M>0.

9. The system as recited in claim 1, wherein at least one of the at least two error detection bits for each byte is a single-bit error detection bit.

10. The system as recited in claim 9, wherein the single-bit error detection bit includes a parity bit.

11. The system as recited in claim 6, wherein the at least two error detection bits for each byte are two-bit error detection bits.

12. The system as recited in claim 11, wherein the two-bit error detection bits are parity bits.

13. A system for providing a net signalling current of substantially zero at each cycle time for reducing a noise level for simultaneous switching outputs of an integrated circuit chip and generating a signal having at least one error detection bit, the system comprising:

an encoder that encodes an R bit input word to an S bit output word, the encoder encoding each of P groupings of M number of binary bits of the R bit input word to an even number of N encode binary bits to form the S bit output word, the M number of binary bits being selected such that one P grouping of M number of binary bits includes binary bits of the R bit input word and at least one error detection bit for each byte of the R bit input word, the combinations of N encode binary bits including an equal number of binary "1" values and binary "0" values, with P>0, M>0, R>0, N an even number, and N an even number M; and a receiver that receives words encoded by an encoder and counts the binary "1" values and the binary "0" values in the received encoded words to determine if any of said encoded words contain data transmission errors.

14. The system as recited in claim 13, wherein the encoder encodes each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

15. The system as recited in claim 14, wherein the encoder encodes each combination of the M number of binary bits according to one of the $2^M$ combinations from the set of combinations of N encode binary bits, with M>0.

16. The system as recited in claim 1, wherein the at least one error detection bit associated with each byte is a single-bit error detection bit.

17. The system as recited in claim 16, wherein the single-bit error detection bit includes a parity bit.

18. A system for providing a net signalling current of substantially zero at each cycle time for reducing a noise level for simultaneous switching outputs of an integrated circuit chip and generating a signal having at least two error detection bits, the system comprising:

an encoder that encodes an R bit input word to an S bit output word, the encoder encoding each of P groupings of M number of binary bits of the R bit input word to an even number of N encode binary bits to form the S bit output word, the M number of binary bits being selected such that one P grouping of M number of binary bits includes binary bits of the R bit input word and at least two error detection bits for each byte of the R bit input word, the combinations of N encode binary bits including an equal number of binary "1" values and binary "0" values, with P>0, M>0, R>0, N an even number, and N an even number M; and a receiver that receives words encoded by an encoder and counts the binary "1" values and the binary "0" values in the received encoded words to determine if any of said encoded words contain data transmission errors.

19. The system as recited in claim 18, wherein the encoder encodes each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

20. The system as recited in claim 19, wherein the encoder encodes each combination of the M number of binary bits according to one of the $2^M$ combinations from the set of combinations of N encode binary bits, with M>0.

21. The system as recited in claim 18, wherein at least one of the at least two error detection bits for each byte is a single-bit error detection bit.

22. The system as recited in claim 21, wherein the single-bit error detection bit includes a parity bit.

23. The system as recited in claim 18, wherein the at least two error detection bits for each byte are two-bit error detection bits.

24. The system as recited in claim 23, wherein the two-bit error detection bits are parity bits.

25. A method for providing a net signaling current of substantially zero at each cycle time for reducing a noise level for simultaneous switching outputs of an integrated circuit chip and generating a signal having at least one error detection bit, the method comprising encoding an R bit input, word to an S bit output word by encoding each of P groupings of M number of binary bits of the R bit input word to an even number of N encode binary bits to form the S bit output word, with each combination of the M number of binary bits being encoded according to one combination of N encode binary bits, the M number of binary bits being selected such that one P grouping of M number of binary bits includes binary bits of the the R bit input word and at least one error detection bit for each byte of the R bit input word, and the combinations of N encode binary bits including an equal number of binary "1" values and binary "0" values, with P>0, M>0, R>0, N an even number >1, and N an even number >M.

26. The method as recited in claim 25, wherein encoding further includes encoding each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

27. The method as recited in claim 26, wherein encoding still further includes encoding each combination of the M number of binary bits according to one of the $2^M$ combinations from the set of combinations of N encode binary bits, with M>0.

28. The method as recited in claim 25, wherein generating a signal having at least one error detection bit includes providing a single-bit error detection bit for each byte.

29. The method as recited in claim 28, wherein generating a signal having at least one error detection bit includes providing a parity bit for each byte.

30. A method for providing a net signaling current of substantially zero at each cycle time for reducing a noise level for simultaneous switching outputs of an integrated circuit chip and generating a signal having at least two error detection bits, the method comprising encoding an R bit input word to an S bit output word by encoding each of P groupings of M number of binary bits of the R bit input word to an even number of N encode binary bits to form the S bit output word, with each combination of the M number of binary bits being encoded according to one combination of N encode binary bits, the M number of binary bits being selected such that one P grouping of M number of binary bits includes binary bits of the the R bit input word and at least two error detection bits for each byte of the R bit input word, and the combinations of N encode binary bits including an equal number of binary "1" values and binary "0" values, with P>0, M>0, R>0, N an even number >1, and N an even number >M.

31. The method as recited in claim 30, wherein encoding further includes encoding each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

32. The method as recited in claim 31, wherein encoding still further includes encoding each combination of the M number of binary bits according to one of the $2^M$ combinations from the set of combinations of N encode binary bits, with M>0.

33. The method as recited in claim 30, wherein generating a signal having at least two error detection bits includes providing at least one single-bit error detection bit for each byte.

34. The method as recited in claim 33, wherein generating a signal having at least two error detection bits includes providing a parity bit for each byte.

35. The method as recited in claim 30, wherein generating a signal having at least two error detection bits includes providing two-bit error detection bits for each byte.

36. The method as recited in claim 35, wherein providing two-bit error detection includes providing two parity bits.

37. A method for providing a net signaling current of substantially zero at each cycle time for reducing a noise level for simultaneous switching outputs of an integrated circuit chip and generating a signal having at least one error detection bit, the method comprising the steps of:

(a) encoding an R bit input word to an S bit output word by encoding each of P groupings of M number of binary bits of the R bit input word to an even number of N encode binary bits to form the S bit output work, with each combination of the M number of binary bits being encoded according to one combination of N encode binary bits, the M number of binary bits being selected such that one P grouping of M number of binary bits includes binary bits of the the R bit input word and at least one error detection bit for each byte of the R bit input word, and the combinations of N encode binary bits including an equal number of binary "1" values and binary "0" values, with P>0, M>0, R>0, N an even number >1, and N an even number >M; and (b) receiving words encoded according to step (a) and, counting the binary "1" values and the binary "0" values in the received encoded words for determining if there are data transmission errors in said received encoded words.

38. The method as recited in claim 37, wherein step (a) further includes encoding each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

39. The method as recited in claim 38, wherein step (a) still further includes encoding each combination of the M number of binary bits according to one of the $2^M$ combinations from the set of combinations of N encode binary bits, with M>0.

40. The method as recited in claim 38, wherein generating a signal having at least one error detection bit includes providing at least one single-bit error detection bit for each byte.

41. The method as recited in claim 40, wherein generating a signal having at least one error detection bit includes providing a parity bit for each byte.

42. A method for providing a net signaling current of substantially zero at each cycle time for reducing a noise level for simultaneous switching outputs of an integrated circuit chip and generating a signal having at least two error detection bits, the method comprising the-steps of:

(a) encoding an R bit input word to an S bit output word by encoding each of P groupings of M number of binary bits of the R bit input word to an even number of N encode binary bits to form the S bit output word, with each combination of the M number of binary bits being encoded according to one combination of N encode binary bits, the M number of binary bits being selected such that one P grouping of M number of binary bits includes binary bits of the the R bit input word and at least two error detection bits for each byte of the R bit input word, and the combinations of N encode binary bits including an equal number of binary "1" values and binary "0" values, with P>0, M>0, R>0, N an even number >1, and N an even number >M; and (b) receiving words encoded according to step (a) and, counting the binary "1" values and the binary "0" values in the received encoded words for determining if there are data transmission errors in said received encoded words.

43. The method as recited in claim 42, wherein step (a) further includes encoding each combination of M number of binary bits according to one combination of N encode binary bits selected from a set of combinations of N encode binary bits determined by the expression:

$$\text{Combos. of } N \text{ Encode Binary Bits} = \frac{N!}{(1/2\,N)! * (1/2\,N)!}$$

where,

N=Even number of bits greater than M number of bits.

44. The method as recited in claim 43, wherein step (a) still further includes encoding each combination of the M number of binary bits according to one of the $2^M$ combinations from the set of combinations of N encode binary bits, with M>0.

45. The method as recited in claim 42, wherein generating a signal having at least two error detection bits includes providing at least one single-bit error detection bit for each byte.

46. The method as recited in claim 45, wherein generating a signal having at least two error detection bits includes providing a parity bit for each byte.

47. The method as recited in claim 42, wherein generating a signal having at least two error detection bits includes providing two-bit error detection bits for each byte.

48. The method as recited in claim 47, wherein providing two-bit error detection includes providing two parity bits.

* * * * *